(12) United States Patent
Ghittori et al.

(10) Patent No.: US 10,454,491 B1
(45) Date of Patent: Oct. 22, 2019

(54) SUCCESSIVE APPROXIMATION REGISTER (SAR) ANALOG TO DIGITAL CONVERTER (ADC) WITH PARTIAL LOOP-UNROLLING

(71) Applicant: eSilicon Corporation, San Jose, CA (US)

(72) Inventors: Nicola Ghittori, Pavia (IT); Claudio Nani, Milan (IT); Enrico Monaco, Modena (IT)

(73) Assignee: eSilicon Corporation, San Jose, CA (US)

( * ) Notice: Subject to any disclaimer, the term of this patent is extended or adjusted under 35 U.S.C. 154(b) by 0 days.

(21) Appl. No.: 16/239,421

(22) Filed: Jan. 3, 2019

(51) Int. Cl.
*H03M 1/34* (2006.01)
*H03M 1/40* (2006.01)
*H03M 1/36* (2006.01)
*H03M 1/46* (2006.01)
*H03M 1/00* (2006.01)
*H03M 1/12* (2006.01)
*H03M 1/06* (2006.01)
*H03M 1/10* (2006.01)

(52) U.S. Cl.
CPC .............. *H03M 1/40* (2013.01); *H03M 1/368* (2013.01); *H03M 1/462* (2013.01); *H03M 1/00* (2013.01); *H03M 1/06* (2013.01); *H03M 1/1009* (2013.01); *H03M 1/12* (2013.01); *H03M 1/365* (2013.01); *H03M 2201/2266* (2013.01)

(58) Field of Classification Search
CPC ........ H03M 1/00; H03M 1/12; H03M 1/1009; H03M 1/06; H03M 1/365
USPC ........ 341/161, 155, 120, 118, 158, 142, 159
See application file for complete search history.

(56) References Cited

U.S. PATENT DOCUMENTS 4,894,656 A * 1/1990 Hwang ............... H03M 1/1038
341/120

* cited by examiner

*Primary Examiner* — Joseph J Lauture
(74) *Attorney, Agent, or Firm* — Fenwick & West LLP

(57) ABSTRACT

A receiver system that includes an ADC for converting analog values to digital representations. A digital representation is a sum of discrete values some of which are non-binary scaled and the other are binary scaled. The ADC includes dedicated comparators to determine whether to add or to subtract the non-binary scaled values. A comparator is used to determine whether to add or to subtract the binary scaled values. The ADC further calibrates offset voltages of the comparators to substantially remove dead zone and conversion errors, without compromising the conversion speed. The calibration can be performed both in foreground and background.

20 Claims, 5 Drawing Sheets

SUCCESSIVE APPROXIMATION REGISTER (SAR) ANALOG TO DIGITAL CONVERTER (ADC) WITH PARTIAL LOOP-UNROLLING

BACKGROUND

1. FIELD OF THE DISCLOSURE

This disclosure pertains in general to digital transceivers, and more specifically to analog to digital converters.

2. DESCRIPTION OF THE RELATED ART

Serial/Deserializers (SerDes's) are widely used in applications that involve gigabit rate links. Compared to parallel links, serial communication has many advantages such as no crosstalk noise, occupies less area, and consumes less power. Analog to digital converters (ADC) are used in SerDes's to digitize analog signals to achieve channel equalization. However, ADCs can be power hungry and present challenges in integrating ADCs in SerDes's, especially in high speed operation.

SUMMARY

Integration of high speed, low power and area efficient ADCs is a key differentiator in the design of the receiver (RX) path of an ADC-based Serializer-Deserializer (SerDes) transceiver. An ADC converts analog values to digital representations. A digital representation is a sum of discrete values some of which may be non-binary scaled and/or binary scaled. The ADC includes dedicated comparators to determine whether to add or to subtract the non-binary scaled values. A comparator is used to determine whether to add or to subtract the binary scaled values. The ADC further calibrates offset voltages of the comparators to substantially remove dead zone and conversion errors, without compromising the conversion speed. The calibration can be performed both in foreground and background.

Other aspects include components, devices, systems, improvements, methods, processes, applications and other technologies related to the foregoing.

BRIEF DESCRIPTION OF THE DRAWINGS

The teachings of the embodiments disclosed herein can be readily understood by considering the following detailed description in conjunction with the accompanying drawings.

DETAILED DESCRIPTION

The Figures and the following description relate to various embodiments by way of illustration only. It should be noted that from the following discussion, alternative embodiments of the structures and methods disclosed herein will be readily recognized as viable alternatives that may be employed without departing from the principles discussed herein. Reference will now be made in detail to several embodiments, examples of which are illustrated in the accompanying figures. It is noted that wherever practicable similar or like reference numbers may be used in the figures and may indicate similar or like functionality.

Operation

Figure 1A:
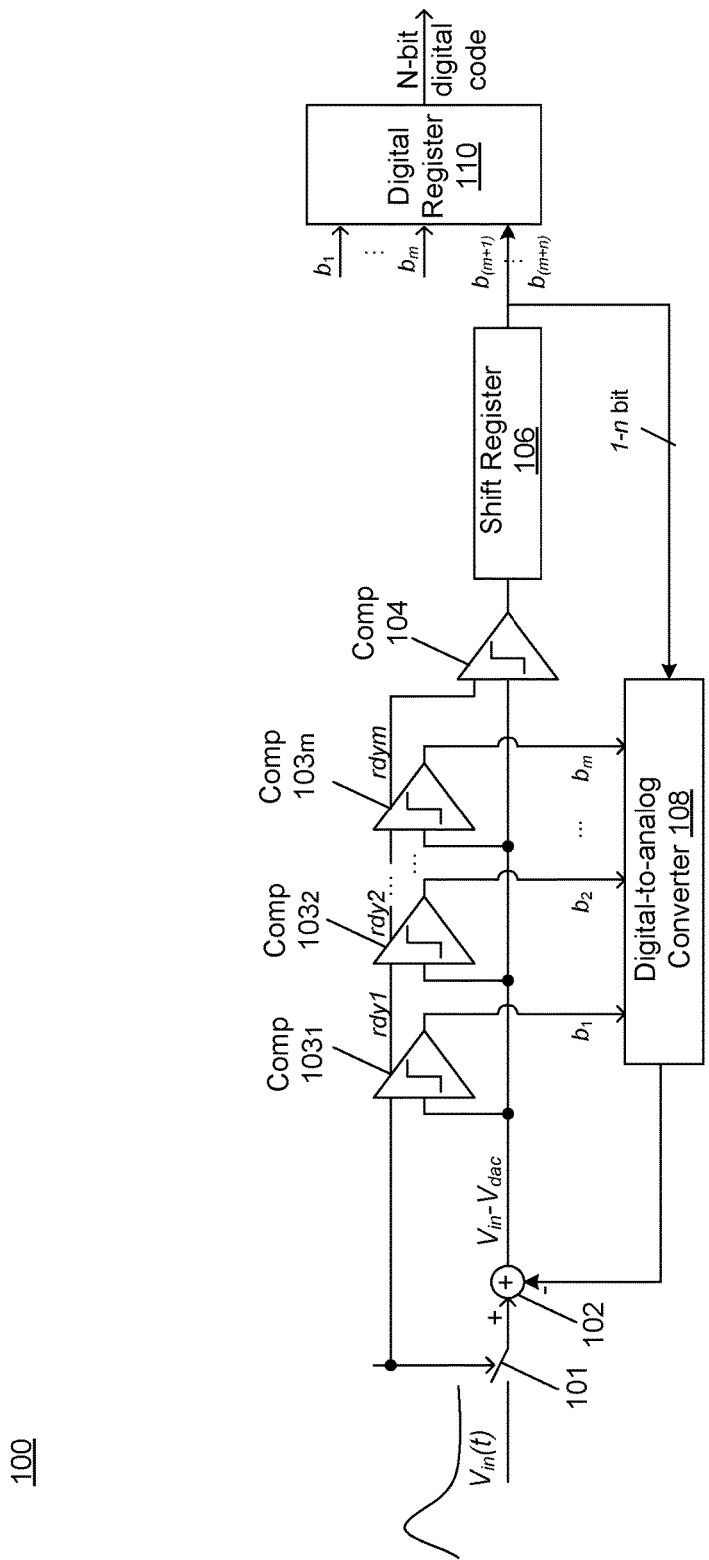
FIG. 1A is a block diagram illustrating an example partial loop-unrolling successive approximation register (SAR) analog-to-digital converter (ADC), according to one embodiment.

FIG. 1A is a block diagram illustrating an example partial loop-unrolling successive approximation register (SAR) analog-to-digital converter (ADC), according to one embodiment. The example SAR ADC 100 outputs an N-bit digital signal. The example partial loop-unrolling SAR ADC 100 generates the N-bit digital signal in Nc quantization cycles. The number of cycles Nc (Nc=m+n) is greater than the number of digits to introduce redundancy in the conversion process of the ADC 100 by means of non-binary scaling of the weights. Out of the Nc cycles, m cycles are non-binary cycles where the discrete values are non-binary scaled and n cycles are binary cycles where the discrete values are binary scaled. The most significant bits (MSBs) are determined in m cycles and the least significant bits (LSBs) are determined in n cycles. A loop-unrolled approach is applied to make the determination in the m cycles. That is, for each of the m most significant bits (MSBs), an individual comparator determines whether the discrete value should be added or subtracted. For the n cycles, one comparator is used to determine whether to add or to subtract the discrete values for all n least significant bits (LSBs). The m cycles are also referred herein as "loop-unrolled cycles" and the n cycles are also referred herein as "SAR cycles." By doing this, the proposed ADC achieves an optimum power consumption, operation speed, and area occupation.

Figure 1B:
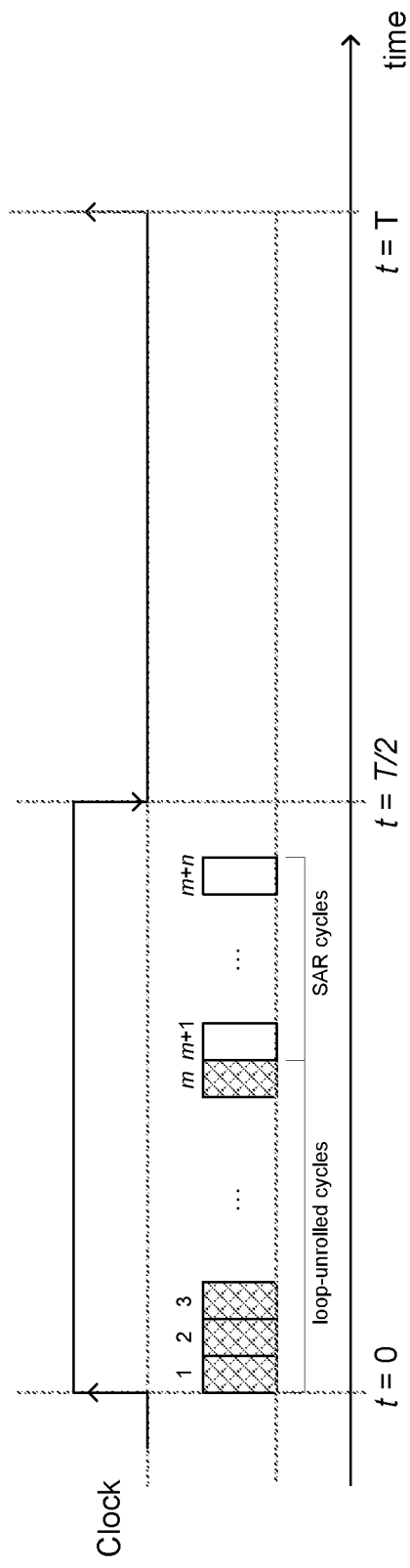
FIG. 1B is a timing diagram of an example ADC, according to one embodiment.

The ADC 100 includes a sampling switch 101, an adder 102, a series of comparators $103_{1-m}$, a comparator 104, a shift register 106, a digital-to-analog converter (DAC) 108, and a digital register 110. The comparators $103_{1-m}$ are also collectively referred to as the comparators 103. As illustrated, one terminal of the sampling switch 101 is the input terminal of the ADC 100 and the other terminal of the sampling switch 101 is connected to the adder 102. FIG. 1B is a timing diagram of the ADC 100. FIGS. 1A and 1B are described in connection with each other to illustrate the operation of the ADC 100.

The ADC 100 is driven by a clock signal to take samples of an incoming analog signal $V_{in(t)}$. The ADC 100 can sample the incoming analog signal at rising edges of the clock signal. That is, at each rising edge of the clock signal, the ADC 100 takes a sample of the incoming analog signal and converts the sampled value to a N-bit digital symbol representing the sampled value as shown in Equation (1):

$$V_{ADC} = \Sigma_1^{Nc} b_i \times w_i \quad (1),$$

where i is an integer in the range of [1, Nc] and represents one of the Nc cycles, $b_i$ is a logical signal determined in the i cycle, and $w_i$ is the weight (i.e., discrete value) in the i cycle. The logical signal $b_i$ has values indicating whether the corresponding weight $w_i$ should be added or subtracted.

The sampling switch 101 is controlled according to the clock signal. As illustrated in FIG. 1B, in a clock cycle T, the sampling switch 101 is switched off according to the rising edge of the clock signal and stays off for a half clock cycle (0–T/2) when the clock signal is in its high state. When the sampling switch 101 is turned off, the ADC 100 samples and converts the incoming analog signal to a N-bit digital symbol. The sampling switch 101 is switched on according to the falling edge of the clock signal and stays on for the half-cycle (T/2–T) when the clock signal is in its low state. When the sampling switch 101 is on, the ADC 100 is in tracking mode where it pauses the conversion until the next clock cycle.

The adder takes as input the sampled value $V_{in}(zT)$ and the output of the DAC 108 and outputs a difference signal ($V_{in}(zT)-V_{DAC}$), where z is an integer. The output of the DAC 108 represents an existing digital conversion of the sampled value. The difference signal represents the remaining analog value to be converted. In a loop-unrolled cycle i, the difference signal is provided as an input to a comparators $103_i$ and serves as the basis for the comparator $103_i$ to determine the logical signal $b_i$. In a SAR cycle i, the difference signal is provided as an input to the comparator 104 and serves as the basis for the comparator 104 to determine the logical signal $b_i$.

To determine the logical signal $b_i$ (i.e., whether to add or subtract a discrete value $w_i$), the comparator $103_i$ (or the comparator 104) compares the sampled value $V_{in}(zT)$ to the DAC's output $V_{DAC}$. If the sampled value $V_{in}(zT)$ is greater than (less than) the DAC's output $V_{DAC}$, the comparator outputs the logical signal $b_i$ having a positive (negative) value indicating that the discrete value $w_i$ is to be added (subtracted). The outputs of the comparator $103_i$ (or the comparator 104) can be determined according to Equations (2)-(3):

$$b_i = +1 \text{ if } V_{in(zT)} > V_{DAC} \quad (2),$$

$$b_i = -1 \text{ if } V_{in(zT)} < V_{DAC} \quad (3).$$

In addition to generating the logical signal the comparator $103_i$ outputs a ready signal ($rdy_i$) that enables the next comparator $103_{(i+1)}$ (or 104) to make the determination. For example, as illustrated, the ready signal $rdy_i$ output by the comparator 103-1 that determines the logical signal $b_1$ enables the comparator 103-2 to make the determination on the logical signal $b_2$. The ready signal $rdy_m$ output by the comparator 103m enables the comparator 104 to make the determination on the logical signal bon-pp.

In each SAR cycle, the comparator 104 outputs the logical signal $b_i$ to the shift register 106. At a given time, the shift register 106 stores one or more logical signals that have been outputted by the comparator 104 and provides the logical signals to the DAC 108. Additionally, the comparator 104 generates a ready signal that triggers the comparator 104 to reset and to make the determination for the next cycle after a delay.

As described above, the DAC's 108 output $V_{DAC}$ is the existing digital conversion of the sampled analog value. In a cycle i, the DAC's output can be determined according to Equation (4):

$$V_{DAC} = \sum_{1}^{i-1} b_j \times w_j \quad (4),$$

where j is an integer in the range of [1, i–1], $b_j$ is a logical signal determined in the j cycle, and $w_j$ is the weight in the j cycle. As shown in Equation (4), the DAC's output is updated when a comparator determines to add or to subtract a discrete value.

The digital register 110 outputs the N-bit digital symbol. The digital register 110 combines the logical signals generated by the comparators 103-104 with their corresponding weights to determine the N-bit converted digital signal according to Equation (1).

The partial loop-unrolling SAR ADC 100 achieves a power efficient digital conversion of analog signals while maintaining a high conversion speed, a low area occupation, as well as optimized noise performance and error tolerance. Because dedicated comparators are used for making determinations for the MSBs, these comparators do not need to be reset during the conversion. This is beneficial for the conversion speed. In addition, the noise and power consumption of the comparators used in the loop-unrolling cycles can be optimized for every cycle of comparison, for example based on the amount of redundancy available at that cycle. Furthermore, because one comparator is reused in all SAR cycles to make determinations for LSBs that are more subject to comparator noises, the comparator noise can be optimized such that it is negligible compared to quantization noise.

In one embodiment, the ADC 100 outputs a 7-bit digital signal and the full-scale (FS) is 64. The ADC 100 employs 8 cycles to digitize an analog sample according to Equation (5):

$$V_{ADC} = (b_1 \cdot 34 + b_2 \cdot 18 + b_3 \cdot 10 + b_4 \cdot 5) + (b_5 \cdot 4 + b_6 \cdot 2 + b_7 \cdot 1 + b_8 \cdot 0.5) \quad (5).$$

In this particular embodiment, 4 cycles are loop-unrolled cycles where dedicated comparators determine the logical signals $b_1$-$b_4$, and 4 cycles are SAR cycles where one comparator determines the logical signals $b_5$-$b_8$. Other combinations of weights are also possible.

In the illustrated example, the ADC 100 samples the incoming analog signal at rising edges of the clock signal. The ADC 100 can also sample the incoming analog signal at falling edges of the clock signal or at both rising and falling edges of the clock signal.

Figure 2A:
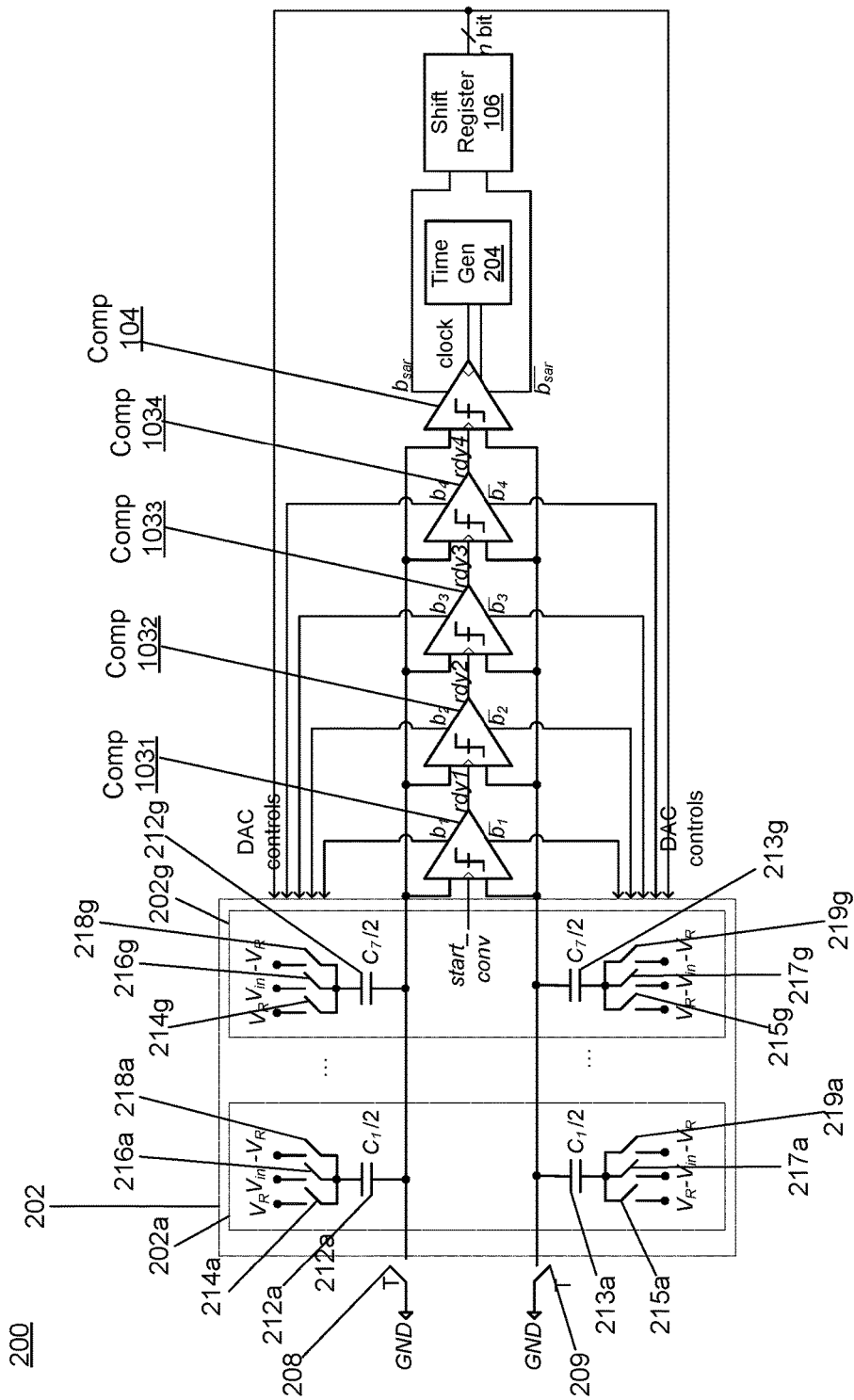
FIG. 2A is a block diagram illustrating an example ADC that outputs a 7-bit digital signal using 8 conversion cycles, according to one embodiment.

FIG. 2A is a block diagram illustrating an example ADC 200 that outputs a 7-bit digital signal using 8 conversion cycles. Out of the 8 conversion cycles, 4 are loop-unrolled cycles and 4 are SAR cycles. The ADC 200 includes switches 208-209, a capacitive array 202, comparators $103_{1-4}$, 104, a clock generator 204, and a shift register 106. The capacitive array 202a-g implements the adder 102 and the DAC 108. The capacitive array 202 is a charge-redistribution capacitive array and includes capacitive units 202a-g. The capacitive units 202a-g have the same structure but different capacitances. Take the capacitive unit 202a for example, the capacitive unit 202a includes capacitors 212a, 213a and switches 214a-219a. The capacitors 212a and 213a have the same capacitance. The bottom-plate of the capacitor 212a is coupled to one terminal of the switch 208 and one input terminal of the comparators $103_{1-4}$ and 104, and the bottom-plate of the capacitor 213a is coupled to one terminal of the switch 209 and the other input terminal of the comparators $103_{1-4}$ and 104. The other terminals of the switches 208 and 209 are coupled to the ground. In addition, the top-plate of the capacitor 212a (213a) is coupled to the input signal $V_{in}$ via the switch 216a (217a), a positive reference signal $V_R$ via the switch 214a (215a), and a negative reference signal $-V_R$ via the switch 218a (219a).

The capacitances of the capacitors $C_1$-$C_7$ of the capacitive array 202a-g are scaled in a non-binary way and the sum of the capacitances $C_1$-$C_7$ is the total capacitance of the DAC. The capacitances can be based on Metal-Oxide-Metal (MOM) structures.

The capacitive array 202 uses a bottom-plate sampling scheme. The bottom-plates of the capacitors 212a through 212g are coupled together and are coupled to the ground via the switch 208. The bottom-plates of the capacitors 213a through 213g are coupled together and are coupled to the ground via the switch 209. The switches 208-209 are controlled according to the clock signal T. In the illustrated example, the signal start cony that is the inverse of the clock signal T is provided to the comparator 103a to trigger the comparator 103a to make a comparison. In the tracking phase, the ADC 200 tracks the analog signal, and in the conversion phase, the ADC 200 samples and converts the analog signal.

In the tracking phase (i.e. the signal start cony is low and the clock signal T is high), the switches 208-209 are on. The switches 216a-g are on to provide the analog signal $V_{in}$ to the top-plates of the capacitors 212a-g. The switches 217a-g are on to provide the analog signal $-V_{in}$ to the top-plates of the capacitors 213a-g. The switches 214a-g, 215a-g coupling the top plates of the capacitors 212a-g, 213a-g to the positive reference voltage $V_R$ and the switches 218a-g, and 219a-g coupling the top plates of the capacitors 212a-g, 213a-g to the negative reference voltage $-V_R$ are off.

At the end of the tracking phase (i.e. the signal start cony transitions from low to high and the clock signal T transitions from high to low), the switches 208-209, the switches 216a-g, and the switches 217a-g are switched off to sample the analog signal $V_{in}$. The switches 214a-g, 215a-g 218a-g, and 219a-g are operated in such a way that the capacitors 212a-g, 213a-g are connected in a balanced way to the reference voltages $V_R$ and $-V_R$. The difference between the signals provided to the terminals of the comparators 103a through 104 is the opposite of the analog value to be converted.

During the conversion phase (i.e. signal start cony high), the capacitors 212a-g and 213a-g are progressively connected to the reference voltage $V_R$ or $-V_R$ according to the comparators decisions that have been determined. The remaining analog value to be converted (i.e., the difference between the input signal and the DAC output signal) is provided to each comparator. The DAC 200 applies the SAR algorithm to approximate the digital conversion to the analog signal by reducing this difference voltage to substantially zero. The error between the analog value and the converted digital value is the quantization error.

Figure 2B:
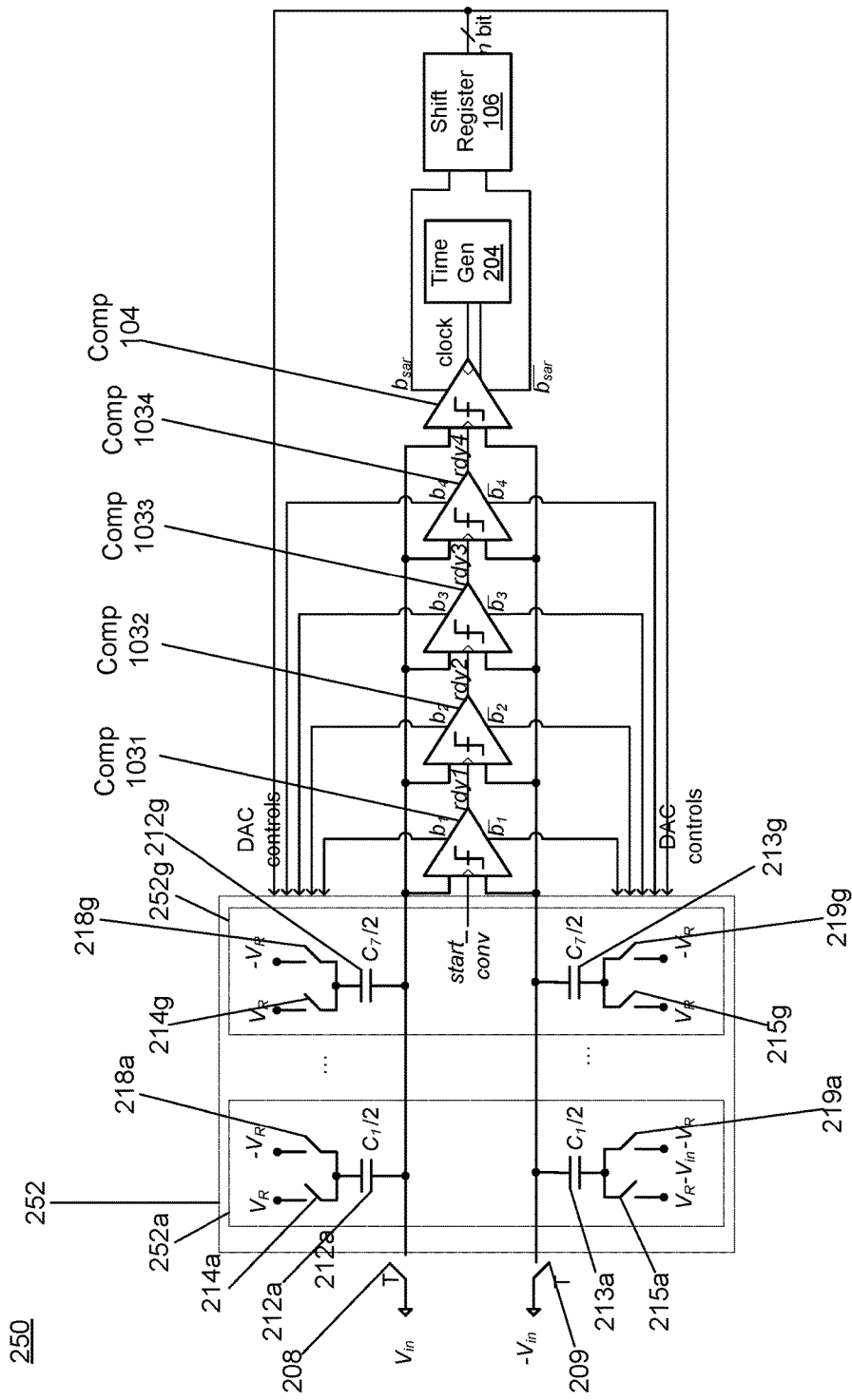
FIG. 2B is a block diagram illustrating an example ADC that outputs a 7-bit digital signal using 8 conversion cycles, according to one embodiment.

FIG. 2B is a block diagram illustrating an example ADC 250 that outputs a 7-bit digital signal using 8 conversion cycles. The example ADC 250 includes switches 208-209, a capacitive array 252, comparators 103a-d, 104, a clock generator 204, and a shift register 106. The capacitive array 252a-g implements the adder 102 and the DAC 108.

Compared to the ADC 200 illustrated in FIG. 2A, the example ADC 250 uses a top-plate sampling scheme. The switch 208 (209) couples the bottom-plates of the capacitors 212a-g (213a-g) to the input analog signal Vin (negative analog signal –Vin) rather than the ground. The top-plates of the capacitors 212a-g, 213a-g are no longer coupled to the input analog signals Vin and –Vin. In the tracking phase, the input analog signals are provided to the bottom-plates of the capacitors 212a-g (213a-g), rather than the top-plates of the capacitors 212a-g (213a-g) as illustrated in FIG. 2A. At the same time the capacitors 212a-g and 213a-g are connected in a balanced way to $V_R$ and $-V_R$. At the end of the tracking phase, the switches 208-209 are switched off to sample the input signal. During the SAR conversion phase, the capacitors 212a-g, 213a-g are progressively connected to $V_R$ or $-V_R$ according to the decisions of the comparators that have been determined.

Compared to the ADC 200, the input analog signals are substantially not attenuated by parasitic capacitance of the comparators that is between the input of the comparators and the ground when being converted by the ADC 250. As a result, the ADC 250 has an improved power consumption and area occupation compared to the ADC 200. The parasitic capacitance is the sum of the parasitic capacitance between the bottom-plates of the capacitors 212a-g, 213a-g and the input parasitic capacitance of the comparators. The attenuation of the reference voltages can be resolved by increasing the reference voltage value.

Calibration of Offset Voltages

Mismatches in offset voltages of the comparators (hereinafter also referred to as "offset mismatches") may cause dead zones in ADCs and subject ADCs to conversion errors which compromise the overall ADC performance. For example, offset mismatches may cause an increase in distortion components and noise floor. As further described below, the offset voltages of the comparators are calibrated to substantially minimize the quantization error.

Figure 3:
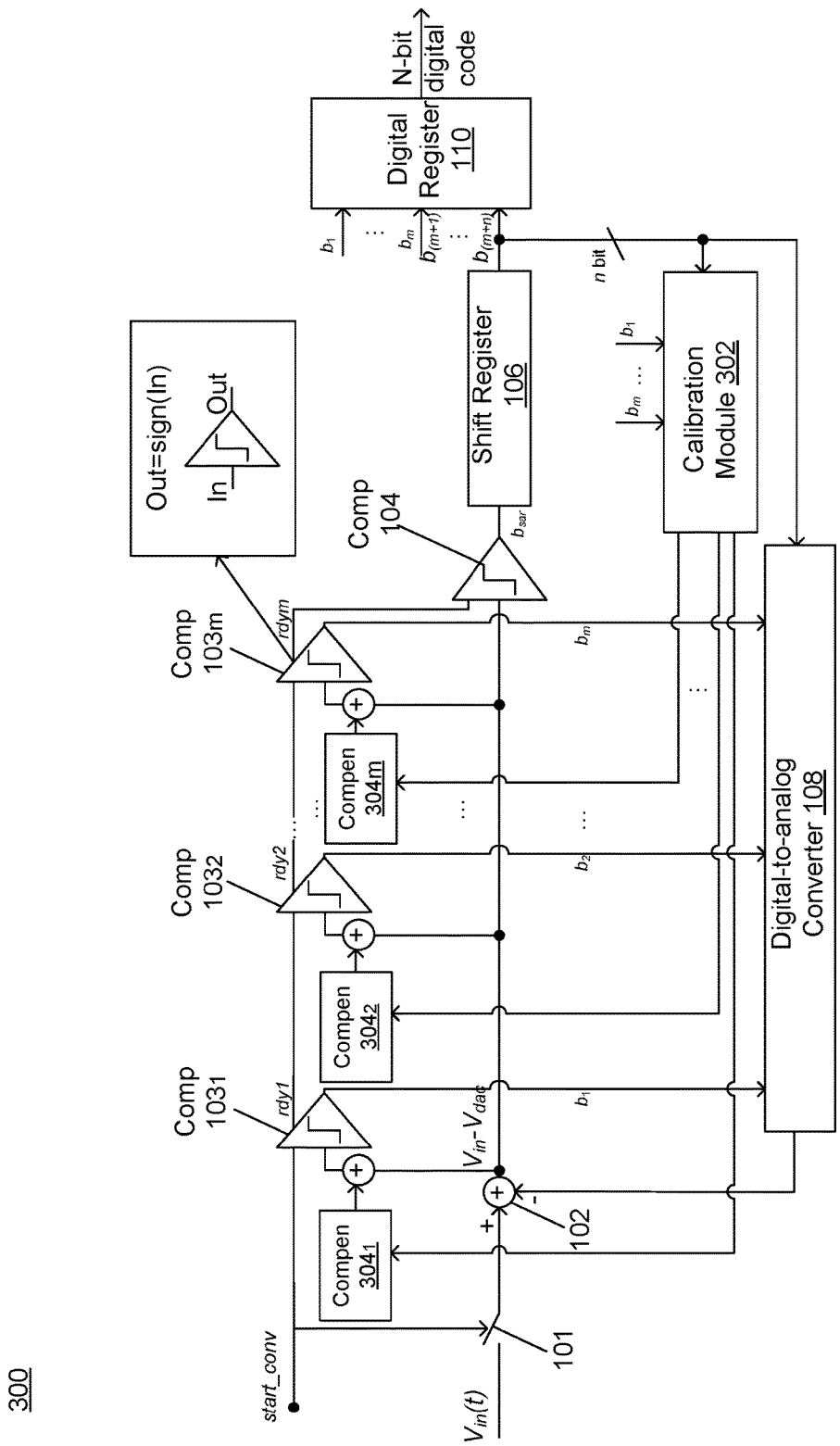
FIG. 3 is a block diagram illustrating an example partial loop-unrolling SAR ADC with comparator offset calibration, according to one embodiment.

FIG. 3A is a block diagram illustrating an example partial loop-unrolling SAR ADC 300 with comparator offset calibration, according one embodiment. The example ADC 300 includes a sampling switch 101, an adder 102, a series of comparators $103_{1-m}$, a comparator 104, a shift register 106, a digital-to-analog converter (DAC) 108, a digital register 110, a calibration module 302, and compensators $304_{1-m}$. A compensator 304 includes a voltage source, a current source, or a programmable resistance (not shown) to a compensation offset to a comparator 103. The calibration module 302 detects a voltage offset for each comparator $103_{1-m}$. The compensators $304_{1-m}$ provide voltage offset compensation to the comparators 103a-m according to the determined voltage offset. The description of a sampling switch 101, an adder 102, a series of comparators $103_{1-m}$, a comparator 104, a shift register 106, a digital-to-analog converter (DAC) 108, and a digital register 110 is provided in connection with FIG. 1.

The calibration module 302 determines voltage offsets that result in dead zones and redundant comparisons. To determine the voltage offset for a comparator 103i, the calibration module 302 adjusts the offset voltage provided to the comparator 103i until the outputs of the comparators 103i-103m and 104 do not include predetermined patterns that correspond to dead zones. The calibration module 302 records the amount of voltage offset provided to the comparator. This amount is the amount of the voltage offset to be compensated. In various embodiments, the calibration module 302 determines the amount of voltage offset that results in dead zones before determining the residual amount of voltage offset that can be measured by analyzing SAR redundant comparisons. The total amount of offset voltage to be compensated is the sum of both amounts.

To determine the amount of offset voltage that causes a dead zone in the ADC 300, the calibration module 302 injects an offset voltage to a comparator 103i. This amount of offset voltage $V_{osi}$ exceeds the redundancy range $(-\varepsilon_{toli}, \varepsilon_{toli})$ that is available at a conversion step i. The redundancy range can be determined according to Equation (10). As a result, a dead zone appears in the input-output characteristic of the ADC 300. The calibration module 302 sets the offset voltage for all comparators 103i-104 to zero. The calibration module 302 adjusts the offset voltage until the comparators' outputs do not include dead zone patterns. For example, the calibration module 302 injects an offset voltage to a comparator 103i, and observes the output of the comparators 103k-104. A dead zone pattern appears when the subsequent comparators 103k-104 have outputs with opposite sign with respect to the output of the comparator 103i as shown in Equations (6)-(7).

$$b_i = +1 \text{ and } b_k = -1 \text{ for } \forall k > i \quad (6)$$

$$b_i = -1 \text{ and } b_k = +1 \text{ for } \forall k > i \quad (7)$$

If a dead zone pattern as indicated in Equations (6)-(7) appears, the calibration module 302 determines that the amount of offset voltage to be compensated for the comparator 103$i$ has the same sign as the output of the comparator 103$i$. A small increase/decrease in the compensation offset is applied to the comparator 103$i$. At the steady state, this amount of offset voltage compensation prevents the dead zone of the comparator 103$i$. The calibration module 302 determines the amounts of offset voltage compensation to remove dead zones for all comparators 103$_{1-m}$. If all the comparators' 103$_{1-m}$ dead zone is compensated, the offsets of the comparators 103$_{1-m}$ do not contribute to conversion errors of the ADC 300.

For each comparator 103$i$, the calibration module 302 determines whether there is any residual voltage offset mismatch between the comparator 103$i$ and 103$j$. The residual offset can be measured by identifying redundant comparisons in subsequent comparators. The calibration module 302 may apply a full-scale signal to the input of the ADC 300. For each comparator 103$i$, the calibration module 302 identifies whether there is any subsequent comparator 103$j$ that has the opposite output with respect to the comparator 103$i$ and whether the weighted sum of all the intermediate comparators' outputs is opposite to the weighted output of the comparator 103$i$ as shown in Equations (8)-(9):

$$\text{if } b_i=+1 \text{ and } b_j=-1 \text{ and } \Sigma_{k=i+1}^{j-1} b_k w_k = -b_i w_i \quad (8),$$

$$\text{if } b_i=-1 \text{ and } b_j=+1 \text{ and } \Sigma_{k=i+1}^{j-1} b_k w_k = -b_i w_i \quad (9).$$

If the comparator 103$j$ exists, the calibration module 302 adjusts the offset voltage provided to the comparator 103$i$ until the above two sequences according to equations (8)-(9) have the same occurrence rate. For example, for every comparator 103$i$, the calibration module 302 decreases (or increases) the offset voltage if the occurrence rate of the outputs of the comparators as shown in equation (8) is larger than (or less than) the occurrence rate the outputs of the comparators as shown in equation (9). The calibration module 302 determines this amount of offset voltage is to be compensated for the comparator. This amount of offset voltage is the offset mismatch between the comparators 103$i$ and 103$j$. This is because if the difference ($V_{in}-V_{dac,i}$) is small during a comparison i, the ADC 300 converts the same difference ($V_{in}-V_{dac,i}$) in one of the subsequent conversion step j. For every redundant cycle i, the sum of DAC weights 14) n (n>i) added or subtracted in the following cycles is greater than $w_i$ and the difference between these two terms defines the available redundancy range $\varepsilon_{toli}$ as shown in Equation (10):

$$\Sigma_{n=i+1}^{Nc} w_n > w_i \text{ and } \varepsilon_{toli} = \Sigma_{n=i+1}^{Nc} w_n - w_i \quad (10).$$

In the redundant comparison case, if the comparator 103$i$ is affected by an offset error $V_{osi}$ that is different from the one which affects the comparator 103$j$ $V_{osj}$, the two decisions $b_i$ and $b_j$ are different. The calibration module 302 makes the determination for all comparators 103$_{1-m}$. If the offset voltage mismatches between the comparators' 103$_{1-m}$ is compensated, the offsets of the comparators 103$_{1-m}$ do not subject the comparators to other errors. As such, the ADC's redundancy range can absorb errors (e.g. noise, reference voltage ripple, etc.) from other sources.

The calibration can be performed in the foreground or in the background. During foreground calibrations, the calibration module 302 applies a dedicated calibration signal to the input of the ADC. For example, an arbitrary analog signal that may improve convergence speed of the calibration is applied to the input of the ADC. The foreground calibration may be performed during the startup of the ADC. During background calibrations, the calibration module 302 uses signals applied to the ADC. The calibration module 302 may apply foreground calibration to track the comparators' offsets drifting during time slots when no signal is applied to the ADC in the application. The calibration can be performed without using any dedicated clock cycles or resetting any comparator at the end of the conversion and thus does not compromise the conversion speed and power consumption of the ADC.

Upon reading this disclosure, those of skill in the art will appreciate still additional alternative designs. Thus, while particular embodiments and applications of the present disclosure have been illustrated and described, it is to be understood that the embodiments are not limited to the precise construction and components disclosed herein and that various modifications, changes and variations which will be apparent to those skilled in the art may be made in the arrangement, operation and details of the method and apparatus of the present disclosure disclosed herein without departing from the spirit and scope of the disclosure as defined in the appended claims.

What is claimed is:

1. An analog to digital converter to convert analog signals into digital symbols comprising:
   an input terminal to receive an input analog signal;
   a plurality of comparators coupled in series and together configured to determine a plurality of discrete values that are non-binary and binary scaled, wherein the comparators include multiple first comparators and a second comparator, each first comparator corresponds to a non-binary scaled discrete value and is configured to determine the non-binary scaled discrete value, the second comparator corresponds to binary scaled discrete values and is configured to determine the binary scaled discrete values; and
   a digital register configured to output a digital symbol by combining the discrete values determined by the comparators, wherein the number of discrete values is greater than a number of digits of the digital symbol.

2. The analog to digital converter of claim 1, wherein the plurality of comparators are configured to determine the discrete values in sequence and each of the comparators determines the corresponding discrete value by comparing a sampled value of the analog signal to an existing digital representation of the sampled value.

3. The analog to digital converter of claim 1, wherein each of the first comparator is further configured to trigger a subsequent comparator to determine the corresponding discrete value, the subsequent comparator being one of the first comparators or the second comparator.

4. The analog to digital converter of claim 1, wherein the second comparator is further configured to trigger itself to reset before determining a subsequent binary discrete value.

5. The analog to digital converter of claim 1, further comprising a digital to analog converter to output an existing digital representation of a sampled value of the analog signal by combining one or more discrete values that have been determined.

6. The analog to digital converter of claim 5, further comprising a shift register coupled to the second comparator, wherein the digital to analog converter is coupled to the first comparators and the shift register.

7. The analog to digital converter of claim 1, further comprising a switch coupled to the input terminal configured to sample a value of the analog signal.

8. The analog to digital converter of claim 1, further comprising a capacitive array comprising a plurality of capacitors, each capacitor having a capacitance corresponding to one of the discrete values.

9. The analog to digital converter of claim 8, wherein a top-plate of each capacitor is coupled to a reference voltage and the input terminal and wherein a bottom-plate of each capacitor is coupled to ground.

10. The analog to digital converter of claim 9, wherein a top-plate of each capacitor is coupled to a reference voltage and wherein a bottom-plate of each capacitor is coupled to the input terminal.

11. A transceiver comprising:
an input terminal to receive an input analog signal;
an analog to digital converter to convert the input analog signal into a digital symbol, comprising:
a plurality of comparators coupled in series and together configured to determine a plurality of discrete values that are non-binary and binary scaled, wherein the comparators include multiple first comparators and a second comparator, each first comparator corresponds to a non-binary scaled discrete value and is configured to determine the non-binary scaled discrete value, the second comparator corresponds to binary scaled discrete values and is configured to determine the binary scaled discrete values; and
a digital register configured to output a digital symbol by combining the discrete values determined by the comparators, wherein the number of discrete values is greater than a number of digits of the digital symbol.

12. The transceiver of claim 11, wherein the plurality of comparators are configured to determine the discrete values in sequence and each of the comparators determines the corresponding discrete value by comparing a sampled value of the analog signal to an existing digital representation of the sampled value.

13. The transceiver of claim 11, wherein each of the first comparator is further configured to trigger a subsequent comparator to determine the corresponding discrete value, the subsequent comparator being one of the first comparators or the second comparator.

14. The transceiver of claim 11, wherein the second comparator is further configured to trigger itself to reset before determining a subsequent binary discrete value.

15. The transceiver of claim 11, wherein the analog to digital converter further comprises a digital to analog converter to output an existing digital representation of a sampled value of the analog signal by combining one or more discrete values that have been determined.

16. The transceiver of claim 15, the analog to digital converter further comprises a shift register coupled to the second comparator, wherein the digital to analog converter is coupled to the first comparators and the shift register.

17. The transceiver of claim 11, further comprising a switch coupled to the input terminal configured to sample a value of the analog signal.

18. The transceiver of claim 11, wherein the analog to digital converter further comprises a capacitive array comprising a plurality of capacitors, each capacitor having a capacitance corresponding to one of the discrete values.

19. The transceiver of claim 18, wherein a top-plate of each capacitor is coupled to a reference voltage and the input terminal and wherein a bottom-plate of each capacitor is coupled to ground.

20. The transceiver of claim 11, wherein a top-plate of each capacitor is coupled to a reference voltage and wherein a bottom-plate of each capacitor is coupled to the input terminal.

* * * * *